INVENTOR.
DINO AMENDOLA
BY Herbert L. Davis
ATTORNEY

Oct. 1, 1968 D. AMENDOLA 3,404,362

SELECTIVE INDEXING GUIDE DEVICE FOR ELECTRICAL CONNECTORS OF PRINTED CIRCUIT CARDS

Filed July 29, 1966 2 Sheets-Sheet 2

INVENTOR.
DINO AMENDOLA
BY Herbert L. Davis
ATTORNEY

United States Patent Office 3,404,362
Patented Oct. 1, 1968

3,404,362

SELECTIVE INDEXING GUIDE DEVICE FOR ELECTRICAL CONNECTORS OF PRINTED CIRCUIT CARDS

Dino Amendola, Paramus, N.J., assignor to The Bendix Corporation, a corporation of Delaware Filed July 29, 1966, Ser. No. 568,963
6 Claims. (Cl. 339—17)

ABSTRACT OF THE DISCLOSURE

A selective indexing guide device for electrical connectors of printed circuit cards whereby the device either excepts or rejects a printed circuit card for mating with the connector thereby eliminating improper connections. The device also provides a guide for the mating of the proper connectors so as to reduce the amount of damage to connector pins and sockets.

The present invention relates to a selective indexing guide device for electrical connectors of printed circuit cards and, more particularly, to a simplified indexing guide device for electrical connectors for circuit cards having electrical circuitry thereon.

In recent years, printed circuitry has been used extensively in electrical equipment applied to automatic pilots, computers and amplifier, and to a large number of removable subassemblies for use in such electrical equipment. These subassemblies are connected electrically by means of electrical connectors of the plug-in type.

In such automatic pilots, computers and amplifier subassemblies, printed circuit cards may be used which are of an identical appearance, but which have specific electrical differences in circuitry and in the operating characteristics thereof. This has presented a problem of connecting this type of printed card circuitry to the apparatus or circuits with which it is specifically designed to be used. In order to prevent such printed circuit card subassemblies from being plugged into the wrong location and operating circuitry, thereby causing damage or malfunction, it is desirable to apply a definite and foolproof indexing device to such electrical connectors.

Heretofore, relatively complex structures have been utilized to prevent mismating between electrical components connectably with one another, including indexing guides having upstanding side flange portions with teeth or notches or recesses adapted to mate only with teeth or notches or recesses provided in like upstanding side flange portions of another mating connector designed to cooperate therewith, as disclosed for example, in British Patent No. 832,658, issued on Apr. 13, 1960. In an alternative shell coding arrangement disclosed in U.S. Patent No. 3,184,707, granted May 18, 1965, to Ralph S. Anderson, there are provided somewhat similar upstanding side flange portions, having notches formed therein for cooperation with coding pins projecting laterally from like upstanding side flange portions of another mating connector.

The shell and flange construction of the indexing devices of the prior patents all necessitated expensive tooling for deep drawing or forming of the can or indexing channel plates with the upstanding side flange portions or shell construction of the mating parts having the required notches and cooperating teeth, or coding pins projecting laterally therefrom.

An object of the present invention is to provide a simplified and novel selective indexing guide device for connectors of printed circuit cards by which the shortcomings of the prior devices may be overcome easily and inexpensively and which will more efficiently provide a far greater number of index positions than either of the prior devices.

Another object of the invention is to provide an improved index device particularly applicable to connectors for printed circuit cards and requiring a right angle bend in only one part, that of the index bracket, so that the same may readily be secured to the printed circuit card and electrical connector part therefor, while an opposite cooperating index guide plate may be fastened to an opposite connector part and in flush relation to a supporting member or chassis so as to shield inner ends of the code pins secured in the index guide plate at the underside thereof from inadvertent displacement.

Another object of the invention is to improve and simplify the selective indexing of connecting devices of the type adaptable for printed circuit cards having electrical circuitry thereon.

More specifically, another object of the invention is to provide an improved and simplified selective indexing guide device for electrical connectors of printed circuit cards to prevent positively the false insertion of an electrical connector part of a circuit card in a connector part other than the particular connector part designed to accommodate the connector part of a given card, and to provide an electrical connector index guide device that is readily adaptable for mounting on a printed circuit card in cooperating relation with the electrical connector therefore and for insertion in a mounting panel in cooperative relation with an index guide plate and an opposite electrical connector specifically arranged for cooperation therewith.

Another object of the invention is to facilitate the fabrication of index guide devices of the type above referred to and to simplify the structure of the index device including an indexing bracket capable of accommodating a printed circuit card and a part of a plug-in electrical connector therefor as well as simplify the structure of an index guide plate capable of being mounted on a supporting chassis together with a mating part of the electrical plug-in connector and having selectively positioned thereon a coding pin or pins to accept or reject the indexing bracket.

Another object of the invention is to provide a simplified and improved index plate and bracket device for connectors of printed circuit cards including three main parts, (1) an index bracket carried by a component printed circuit card, together with a part of a plug-in electrical connector for the circuitry on the card, (2) an index plate secured together with another part of a mating plug-in electrical connector to a supporting chassis, and (3) an index or coding pin or pins selectively positioned on the index plate and in a locked relation thereon so as to selectively accept or reject the index bracket and thereby the part of the electrical connector carried by the printed circuit board.

These and other objects and features of the invention are pointed out in the following description in terms of the embodiment thereof which is shown in the accompanying drawings. It is to be understood, however, that the drawings are for the purpose of illustration only and are not a definition of the limits of the invention, reference being had to the appended claims for this purpose.

In the drawings in which corresponding numerals indicate corresponding parts throughout the several drawings:

FIGURE 1 is a side view of an indexing guide device embodying the invention and including an index bracket secured to one part of an electrical connector carried by a printed circuit card and shown in assembled relation together with an index guide plate carried by a supporting chassis together with another part of the electrical connector with indexing or coding pins being shown selectively positioned in the index guide plate at a stage to accept or reject a mating of the one part of the electrical connector with the other part of the connector.

Figure 1:
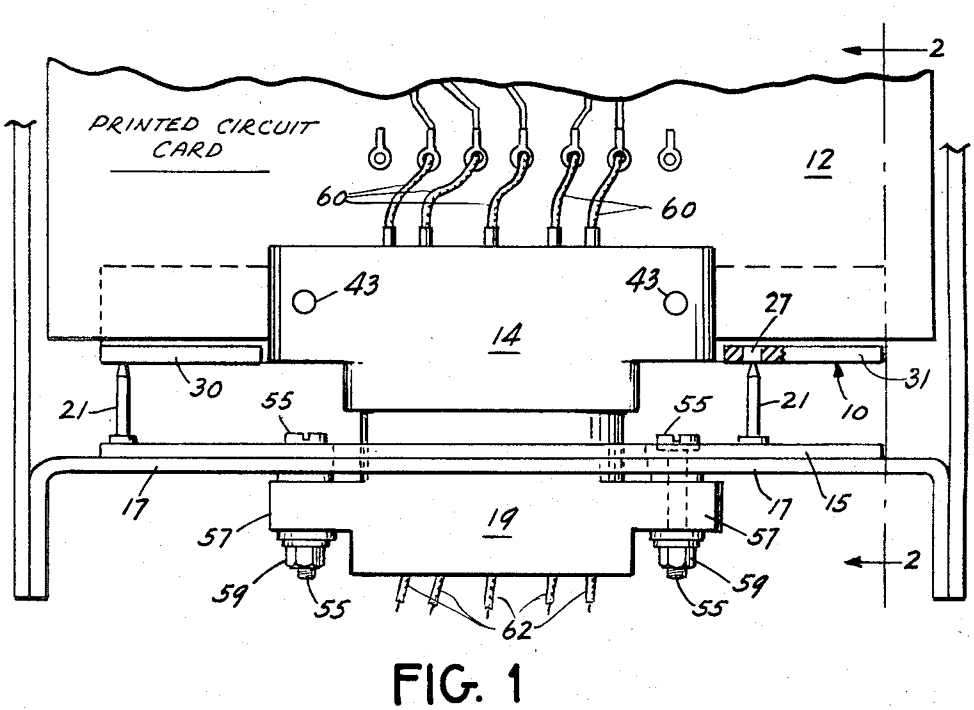
Figure 6:
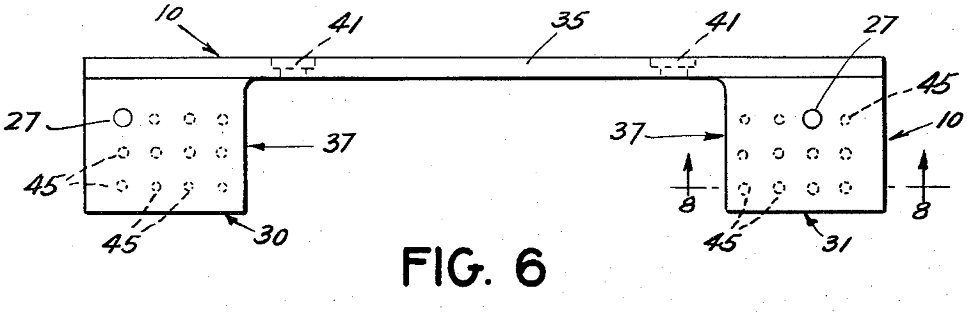
FIGURE 6 is a top plan view of the index bracket of FIGURE 1.
Figures 5, 7, 8:
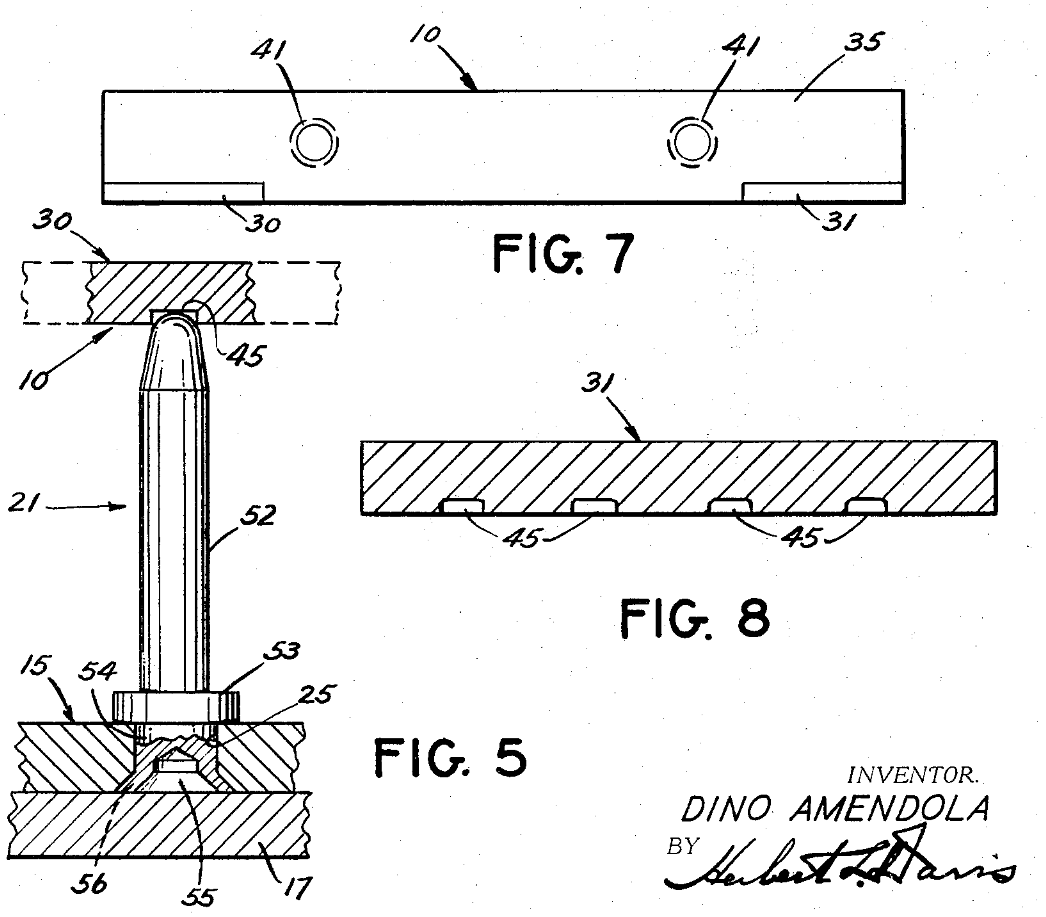
FIGURE 5 is an enlarged detail side view of the index or code pin of FIGURE 1, shown in locked relation in an index hole in the index guide plate 15.
FIGURE 7 is a side view of the index bracket of FIGURE 6.

FIGURE 8 is an enlarged sectional view of a substantially flat plate portion of the index bracket of FIGURE 6, taken along the line 8—8 thereof and looking in the direction of the arrows and illustrating the manner in which index recesses in the index brackets have been formed in the underside to indicate the relative position of corresponding index holes formed in the index plate of FIGURE 1, and in which corresponding index holes, the index or code pin or pins may be selectively positioned.

Referring to the form of the indexing guide device shown at FIGURE 1, the device consists of three main parts:

stantially flat plate portions 30 and 31, together with a bracket 35, to which there is secured a printed circuit card subassembly 12, together with an electrical connector part 14.

(2) A substantially flat index guide plate 15 secured to a substantially flat main supporting plate, member or chassis 17, together with an opposite electrical connector part 19.

(3) An index or code pin or pins 21, which are adapted to be selectively positioned in a plurality of index holes 25 provided in the substantially flat index guide plate 15 for cooperation with a corresponding index hole or holes 27 to be drilled in the substantially flat plates portions 30 and 31 of the index bracket 10 so as to permit a mating of predetermined opposite electrical connector parts 14 and 19.

Figure 2:
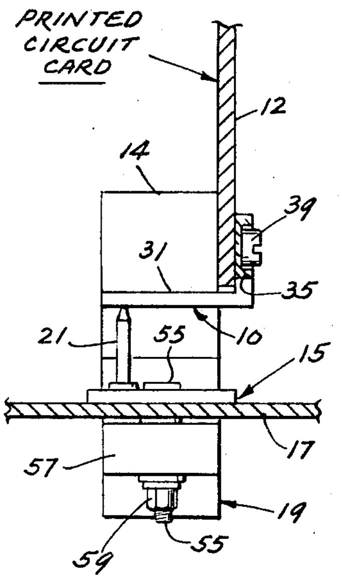
FIGURE 2 is a sectional end view of FIGURE 1 taken along the lines 2—2 and looking in the direction of the arrows.

Referring now to the index bracket device 10, shown in detail in FIGURES 6, 7 and 8, it will be seen that the same includes opposite substantially flat plate portions 30 and 31 from which there project at right angles thereto a bracket portion 35. The bracket portion 35 is connected between the plate portion 30 and the plate portion 31. Intermediate the opposite plate portions 30 and 31, there is provided a recess 37 for receiving the electrical connector part 14 which is secured to the printed circuit card 12 and also to the bracket portion 35 by screw threaded fastening bolts 39. The bolts 39 project through holes 41 in the bracket portion 35 and through the printed circuit card 12 into engaging relation with suitable screw threads in holes 43 provided in the electrical connector part 14 for the printed circuit card 12, as best shown in FIGURES 2 and 3.

Figure 4:
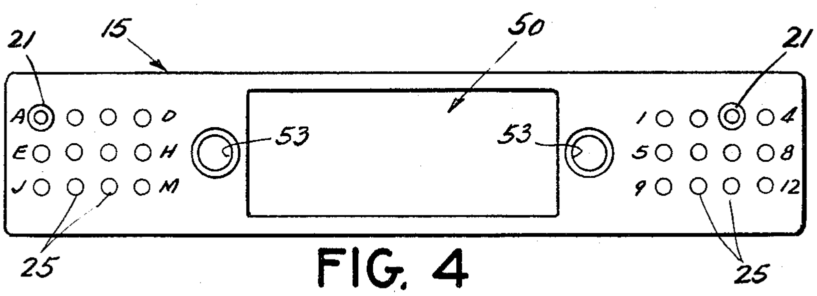
FIGURE 4 is a top plan view of the index guide plate of FIGURES 1 and 3, with the indexing or coding pins shown in a still different position.

It will be further noted from FIGURES 6 and 7, that there are provided on the underside of the substantially flat plate portions 30 and 31 of the index bracket 10, suitably indexed recesses 45 located in positions corresponding to the position of the indexed holes 25 provided through the substantially flat index guide plate 15, shown in FIGURE 4. Thus the index recesses 45 are positioned in matching relation with the index holes 25. The recesses 45 may be selectively drilled then through the substantially flat plate portions 30 and 31, of the index bracket 10 so as to provide the holes 27 in a position corresponding to the selected position of a code pin or pins 21, in the corresponding index hole or holes 25 in the index guide plate 15, to permit the acceptance of the electrical connector part 14 by the electrical connector part 19 to suit a particular application. However, in the absence of the corresponding hole or holes 27 in the substantially flat plate portions 30 and 31 of the index bracket 10, the code pin or pins 21 would be rejected by the plate portions 30 and 31 of the index bracket 10 and in turn cause the rejection of the connectable part 14 so as to prevent the connection of the electrical parts 14 and 19.

The electrical connector parts 14 and 19 are of a conventional type in which part 14 may be made of a suitable nonconductive plastic material having embedded therein a plurality of electrical connector pins, while the opposite part 19 may also be made of a suitable nonconductive plastic material having embedded therein a plurality of corresponding electrical connector pins arranged for connection with the pins carried by the part 14 upon the part 19 being fitted into the part 14 in mating relation.

Figure 3:
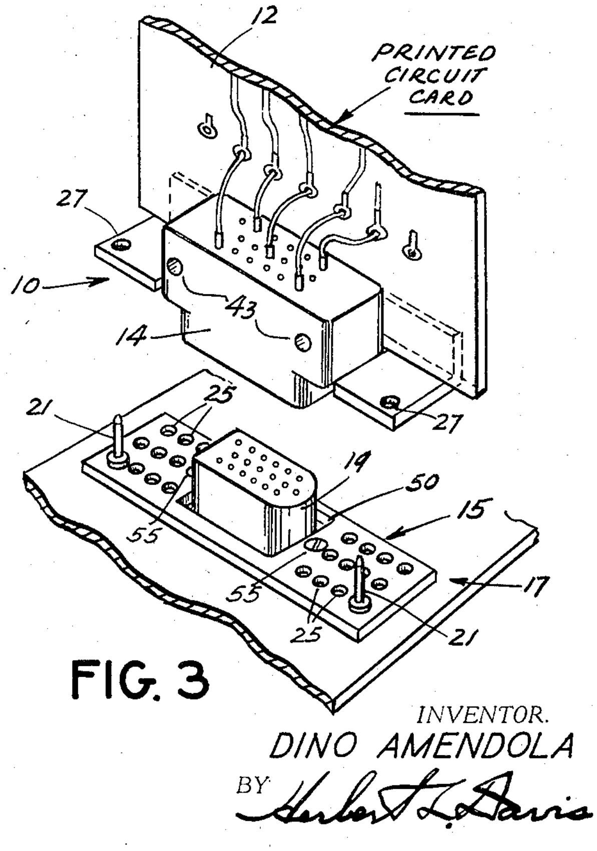
FIGURE 3 is a perspective view of an index guide plate and index bracket assembly embodying the invention and shown in a spaced relation one to the other with the indexing or code pins shown in a different position from FIGURE 1.

Referring now to the index guide plate 15, shown in detail in FIGURE 4, it will be seen that the same includes an opening 50 therein intermediate the opposite ends thereof and of a size corresponding to that of a similar opening formed in the substantially flat supporting plate 17 and through which openings in the plate 15 and supporting plate 17 there may project the electrical connector part 19, as shown in FIGURES 1 and 3.

The index plate 15, includes holes 53 therein for receiving fastening bolts 55 which pass through suitable holes in the substantially flat supporting member or chassis plate 17 and in opposite projecting ear portions 57 of the electrical connector part 19. The bolts 55 are secure in fastening relation by suitable fastening nuts 59 engageable on screw threaded end portions of the bolts 55. The index plate 15 further includes the index holes 25 indicated at one side of the opening 50 by inscribed indicia A–D, E–H and J–M and at an opposite side of the opening 50 by inscribed indicia 1–4, 5–8 and 9–12. There may be selectively positioned in the index holes 25 the code pins 21 which serve to reject or accept the index bracket device 10 dependent upon whether or not there is drilled therein an index hole 27 corresponding in position to that of the related position of the index code pin 21. While two index code pins 21 are shown in various selected code positions, designated by the indicia as J and 10 of FIGURE 1; J and 12 of FIGURE 3, and A and 3 of FIGURE 4, it will be readily apparent that one or more of such pins 21 may be used to effect a desired indexing action.

The substantially flat plate portions 30 and 31 have the recesses 45 formed on the underside thereof similarly indicated by inscribed indicia A–D, E–H and J–M on the underside of the plate portion 30 and inscribed indicia 1–4; 5–8; and 9–12 on the underside of the plate portion 31 so as to correspond to the like inscribed indicia for the index holes 25 of the plate 15.

The operation of the index guide device serves to positively lock out, reject, or prevent the mating of those connector parts 14 and 19 which are to be kept separate, so that if a "wrong" printed circuit board 12 is inserted for mounting on the supporting plate or chassis 17, the index pins 21 will reject such circuit board 12. When the correct printed circuit board 12 is inserted, the index code pins 21 will project through correspondingly positioned holes 27 drilled in the corresponding index recesses 45 of the portions 30 and 31 so as to allow the connector parts 14 and 19 to be operably engaged. The index bracket plate 10 and the index guide plate 15 bear suitable indicia, as heretofore noted, so as to indicate a particular index hole combination, for example, positions A and 3, of FIGURE 4. The index bracket plate 10 is also so inscribed that a corresponding hole 27 may be drilled in the recess 45 for the particular index hole 25 in the index plate 15 in which is selectively positioned the coding pin 21 to be matched therewith.

There is provided a further feature in that in the event of a mismating, and upon the connector parts 14 and 19 being moved to the position illustrated in FIGURE 1, the index or code pins 21 at the free ends thereof will seat in the recesses 45 so as to prevent an excessive force from tending to bend the code pins 21 out of line while at the same time preventing the mating of the connector part 14 with the wrong connector part 19, as shown by FIGURE 5.

In the operation of the invention, it will be seen that a vast number of different index combinations may be readily achieved with the aforedescribed device by selectively positioning one or two or more indexing code pins 21 in the index holes 25 of the plate 15, as may be desired. Further, it will be seen that the index guide plate 15 and the index bracket plate 10 require no additional hardware for the respective securement thereof to the chassis 17 and the printed circuit card 12, than that required for securing the electrical connector part 14 to the printed circuit card 12 by the bolts 39 and the electrical connector part 19 to the supporting chassis or substantially flat supporting plate 17 by the bolts 55.

In addition for field servicing, it will be seen that a kit may be prepared containing the main parts (1), (2), and (3), as heretofore noted, and there may be readily drilled in the selected index recesses 45 in the plate portions 30 and 31 of the bracket plate 10 holes 45 to correspond to the selected holes 25 for the coding pins 21 in the indexing plate 15 to suit the particular application requirements and without the need of expensive or elaborate tooling.

Further, the index or code pin 21 as shown in FIGURE 5, includes a stem portion 52, a flange portion 53 arranged to fit in flush relation to the adjacent surface of the guide plate 15 and a body portion 54 to be inserted in a selected index hole 25 in the guide plate 15. The body portion 54 includes a drilled recess 55 in the end thereof which upon the body portion 54 being inserted in the selected index hole 25 may have the side walls 56 defining the recess 55 in the body portion 54 suitably swaged, or spread, so as to secure the index or code pin 21 in the selected hole 25, as shown by FIGURE 5.

The substantially flat guide plate 15, upon the inner ends of the index or code pins 21 being secured in the selected holes 25, is then fastened in flush relation to the adjacent surface of the substantially flat supporting member or chassis 17, together with the part 19 of the electrical connector by the tightening of the respective fastening bolts 55 and nuts 59 thereon as heretofore explained, so as to shield the ends of the code pins 21 secured in the index holes 25 at the underside of the guide plate 15 from inadvertent displacement.

It will be further noted that, as shown by FIGURE 1, there are provided electrical conductors 60 which lead from suitable terminals of the circuitry on the printed circuit card 12 to terminals of electrical connector prongs of a conventional type carried by the electrical connector part 14 and adapted to mate with other electrical prongs carried by a plug-in type electrical connector part 19 from which lead suitable conductors 62 to other electrical equipment or systems such as an automatic pilot or computer in which the circuitry of the printed circuit card 12 is designed to operate as a subassembly.

Although only one embodiment of the invention has been illustrated and described, various changes in the form and relative arrangement of the parts, which will now appear to those skilled in the art may be made without departing from the scope of the invention. Reference is, therefore, to be had to the appended claims for a definition of the limits of the invention.

What is claimed is:

1. A selective indexing guide means for electrical connectors for circuit cards, comprising an index bracket device, a circuit card, a first part of an electrical connector, means for electrically connecting said first part of the electrical connector to the circuit of said card, and first means to fasten the index bracket device to said circuit card and to said first part of the electrical connector, an index plate device, a second part of the electrical connector, a supporting member, and other second means for fastening the index plate device to said second part of the electrical connector and to said supporting member; index pin means projecting from and selectively positioned on one of said index devices, and the other of said indexing devices having formed therethrough index hole means positioned in corresponding relation to similarly coded index pin means so as to thereupon permit only said similarly coded index pin means to project through said index hole means in an effective mating of the one part with the other part of the electrical connector, while the other of said index devices alternately may serve to reject other nonsimilarly coded index pin means so as to thereupon effectively prevent a mating of the one part with the other part of the electrical connector.

2. The combination defined by claim 1 in which said one index device includes a plurality of index holes, said index pin means being selectively inserted in said index holes and secured therein, and the other of said index devices including a plurality of index recesses corresponding to the index holes of said one index device, said index recesses to be selectively drilled in a similar coded relattion to that of the selected index holes of said one index device in which the index pin means has been selectively inserted.

3. The combination defined in claim 1 in which said index plate device includes a plurality of first index holes, said index pin means includes a plurality of index pins to be inserted selectively in said first index holes and secured therein, and said index bracket device includes a plurality of second index holes formed therethrough and in positions corresponding to that of similarly coded index pins so as to thereupon permit only said similarly coded index pins to project through said second index holes in an effective mating of the one part with the other part of the electrical connector.

4. The combination defined by claim 1 in which the index plate device includes a substantially flat plate having an opening therein intermediate opposite ends of said index plate for receiving the second part of the electrical connector, and said index plate including a plurality of first index holes, said index pin means including a plurality of index pins to be inserted selectively in said first index holes with inner ends of said pins secured at an underside of said plate, and said index bracket device including a pair of substantially flat plates positioned in spaced relation one to the other and interconnected by a bracket portion extending substantially at a right angle to said pair of substantially flat plates, said bracket being fastened by the first means to the circuit card and to the first part of the electrical connector, the first part of the electrical connector being positioned in a space intermediate the pair of substantially flat plates, a plurality of index recesses provided in an underside of the pair of flat plates in corresponding relation to that of the plurality of first index holes in the index plate, a plurality of second index holes provided in selected index recesses and extending through the index bracket device in positions corresponding to that of similarly coded index pins so as to thereupon permit only said similarly coded index pins to project through said second index holes in an effective mating of the one with the other part of the electrical connector, and said substantially flat index plate being fastened by said other second means to the second part of the electrical connector and in flush relation at the underside thereof to an adjacent surface of the supporting member so as to shield the ends of the index pins secured in said index plate at the underside thereof from inadvertent displacement.

5. The combination defined by claim 2 in which said index recesses serve to seat free ends of other nonsimilarly coded index pin means so as to prevent an applied force from tending to bend the last mentioned pin means in the effective prevention thereby of a mating of the one part with the other part of the electrical connector.

6. The combination defined by claim 4 in which the plurality of index recesses provided in the underside of the pair of flat plates serve to seat free ends of other nonsimilarly coded index pins so as to prevent an applied force from tending to bend the last mentioned index pins in the effective prevention thereby of a mating of the one part with the other part of the electrical connector.

References Cited

UNITED STATES PATENTS

| | | | |
|---|---|---|---|
| 2,902,665 | 9/1959 | D'Amico | 339—184 |
| 2,928,998 | 3/1960 | Brumfield | 339—186 X |
| 2,953,767 | 9/1960 | Jackson et al. | 339—184 X |
| 3,281,761 | 10/1966 | Moulin | 339—186 |

MARVIN A. CHAMPION, *Primary Examiner.*

J. R. MOSES, *Assistant Examiner.*